United States Patent
Sorel et al.

[11] Patent Number: 5,907,230
[45] Date of Patent: May 25, 1999

[54] DEVICE FOR ALIGNING AND SUPPORTING AN ARTWORK DURING LIGHT EXPOSURE INSTALLATION OF A PRINTED CIRCUIT BOARD

[75] Inventors: Alain Sorel, Les Baux Saint Croix; Serge Charbonnier, Chambray, both of France

[73] Assignee: Automa-Tech, Val De Reuil, France

[21] Appl. No.: 08/856,436

[22] Filed: May 14, 1997

[30] Foreign Application Priority Data

May 15, 1996 [FR] France ................................ 96 06061

[51] Int. Cl.⁶ .................................................. B64C 17/06
[52] U.S. Cl. ........................................................ 318/649
[58] Field of Search ............................. 318/648, 649, 318/35, 39, 41, 66–79, 85; 414/936–940, 941, 935, 737, 749–753; 324/758

[56] References Cited

U.S. PATENT DOCUMENTS

| | | | |
|---|---|---|---|
| 4,772,846 | 9/1988 | Reeds ..................................... | 324/758 |
| 5,337,151 | 8/1994 | Baxter et al. ......................... | 356/401 |
| 5,395,198 | 3/1995 | Duffy et al. ........................... | 414/217 |
| 5,403,684 | 4/1995 | Schroeder et al. . | |
| 5,669,975 | 9/1997 | Ashtiani ................................. | 118/723 |
| 5,711,647 | 1/1998 | Slocum ................................... | 414/749 |
| 5,726,542 | 3/1998 | Ebihara .................................... | 318/51 |
| 5,759,921 | 6/1998 | Rostoker ................................. | 438/711 |
| 5,760,561 | 6/1998 | Chinju et al. .......................... | 318/593 |

*Primary Examiner*—Jonathan Salata
*Attorney, Agent, or Firm*—Graham & James LLP

[57] ABSTRACT

The invention relates to a device for aligning and supporting an artwork for a light exposure installation of a printed circuit board, whereby the device includes a fixed horizontal supporting structure. The device also includes an artwork support constituted by a rectangular frame and a glass that is integral with the rectangular frame and suitable for receiving an artwork. The device is capable of supporting and lifting the artwork support suitable for maintaining the artwork support horizontal in a given plane and for producing a co-operation which is substantially without any friction between the artwork support and the supporting structure, temporarily securing the supporting structure to the frame of the artwork support, and aligning the artwork support with respect to the supporting structure in a horizontal plane in two orthogonal directions.

5 Claims, 3 Drawing Sheets

DEVICE FOR ALIGNING AND SUPPORTING AN ARTWORK DURING LIGHT EXPOSURE INSTALLATION OF A PRINTED CIRCUIT BOARD

The present invention relates to a device for supporting an artwork for an installation of light exposure of a flat piece and particularly to a printed circuit plate.

BACKGROUND OF THE INVENTION

Within the field of the techniques of printed circuit manufacturing, there are many cases when it is necessary to position an artwork with respect to the plate of a printed circuit for insolation purposes.

This is particularly the case for the insolation step so as to define with photoetching the strip conductors of the printed circuit. The corresponding installation is used to expose to ultraviolet rays, during a given time, the printed circuits covered with a film or a photosensitive resist through an artwork mounted on a mobile support to insolate the corresponding part of the photosensitive resist or film defined by the artwork.

It is clear that a fundamental point of this operation consists in the accuracy of the artwork positioning with respect to the printed circuit on which insolation will be carried out. The artwork is arranged on a horizontal support which is usually made up of a rectangular metal frame on which a glass is fixed, the artwork being arranged on the glass in order to allow for insolation. In the particular case of the invention, the supporting device concerns the case where the artwork is moved be positioned accurately with respect to the flat piece and especially with respect to the printed circuit plate.

In the great majority of this type of machines, the ultraviolet exposure is used for only one side of the printed circuit plate. In this case, the machine has only one support for the artwork which is a lower support. However, when the printed circuit plate is of the double-sided type which is more and more common, the use of machines allowing to simultaneously insolate the printed circuit through two artworks is particularly interesting. Such machines have been proposed, in particular in U.S. Pat. No. 5,337,151 and in European patent application EP 618 505. In such machines, because of the presence of two artworks, it is thus necessary to provide two artwork supports arranged on either side of the printed plate circuit.

Independently of the number of artwork supports among the solutions proposed until now, the artwork support has a certain weight, especially because of the presence of the glass supporting the artwork and the frame weight which must be very rigid, the displacements are obtained by means of two devices usually called tables, each device enabling to move the support in a direction X or in the directions X and Y that are orthogonal with each other. These tables support mechanically the whole support and must thus be at the same time a displacement device in a horizontal plane and a mechanical support in the vertical direction. This means that the motor(s) must have a significant power in case the displacement follows two axes. Moreover, considering the accuracy of the positioning that is desired, the weight and therefore the inertia of the whole support to be moved cause the displacements to be very slow, even though they are very limited, which requires a rather important time period for positioning a support and thus an artwork with respect to the reference piece, that is to say about several tens of seconds.

In the case of an installation, for example to insolate the printed circuit from artworks arranged on the support which operates with an automatic supply of printed circuits, the necessary time to position the support very substantially reduces the operating rate of the whole installation.

This way, there is a real need of artwork support devices which can be moved very accurately but in a reduced time period compared with the currently known solutions.

It is an object of the present invention to provide an artwork support device and more particularly, means for moving this support which make it possible to reduce the time necessary for the final positioning phase while keeping the same accurate positioning.

SUMMARY OF THE INVENTION

To achieve this purpose, according to the invention, the artwork support device for an installation of light exposure of a flat piece including a fixed horizontal supporting structure, is characterised in that it comprises:

an artwork support made up of a rectangular frame and a glass integral with said frame and suitable for receiving an artwork, means for supporting or lifting said support capable of maintaining said horizontal support in a given plane and of producing a cooperation that is substantially without any friction between said support and said supporting structure, controllable means for temporarily securing said supporting structure to the frame of said support, and displacement means integral with said supporting structure for moving said support with respect to said supporting structure in a horizontal plane in two orthogonal directions.

It is thus understood that the displacement means or tables are only used to move the artwork support and never to support or lift it in the case of an upper support. Moreover, the supporting action of the support with respect to the fixed supporting structure is obtained by means having a very small friction. It is thus possible to obtain a very precise and very quick positioning because of the low inertia involved. However, thanks to the temporary fastening means of the support on the supporting structure, the final position of the artwork support with respect to the supporting structure can constantly be maintained during the operation of light exposure.

Other characteristics and advantages of the invention will appear on reading the following description of a preferred embodiment of the invention given by way of non-limiting example.

BRIEF DESCRIPTION OF THE DRAWINGS

The description refers to the accompanying figures in which.

DETAILED DESCRIPTION OF THE PREFERRED EMBODIMENTS

In this type of installation, it is well known that the first step is to carry out a pre-positioning of the printed circuit with respect to the artwork support using retractable positioning fingers. Once this pre-positioning of the printed circuit with respect to the lower and upper artwork supports is achieved, the positioning error is measured with optical means for these three parts. With these positioning error measurements, displacement motors are controlled so as to perform the final positioning which must correspond to a positioning error smaller than 10 microns. The present invention concerns the part of the installation which makes it possible to obtain the final positioning from the measurement of the error corresponding to the pre-positioning.

The optical detection of the positioning error has been described in detail in European patent application 618 505. For this part of the installation, the description of this patent application is used as a reference and must be considered as being an integral part of the present application.

Figure 1A:
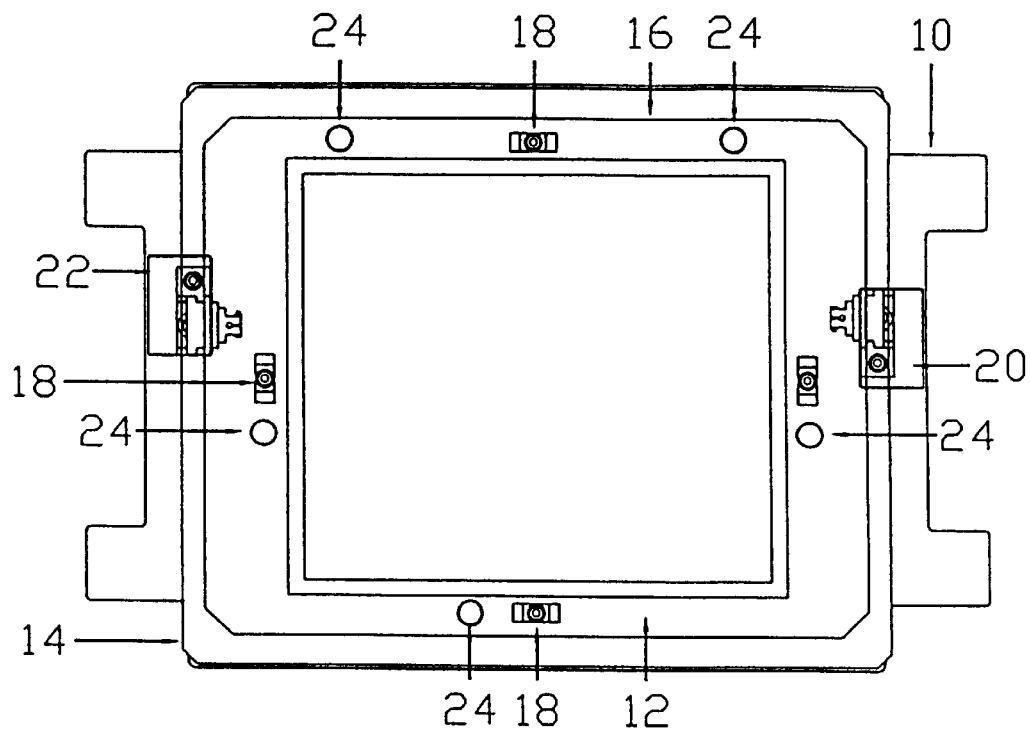
FIG. 1a is a schematic plan view of the lower part of the exposure installation showing the lower artwork support.
Figure 1B:
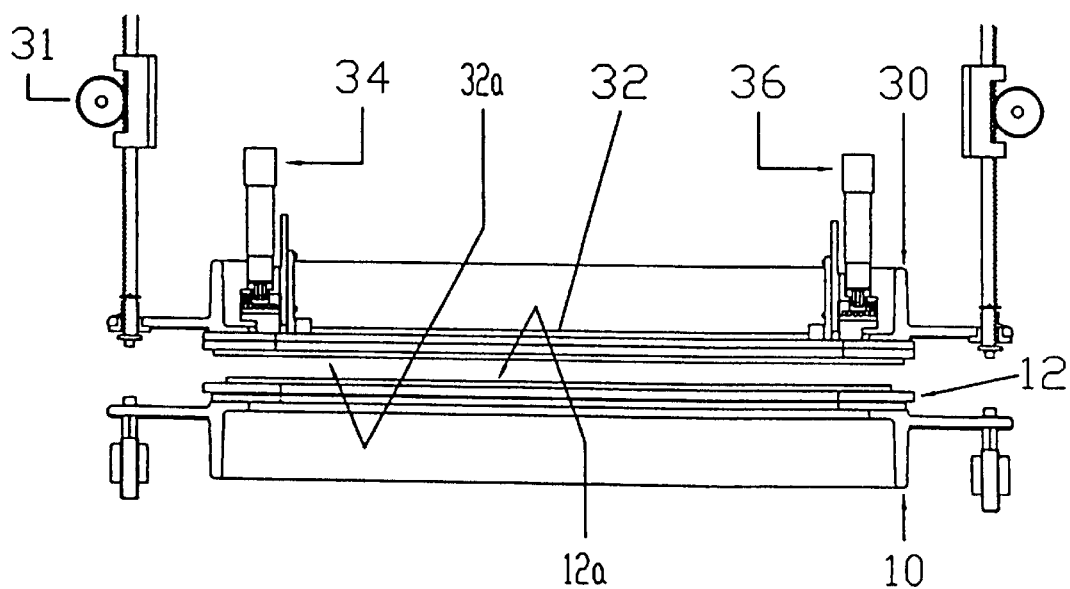
FIG. 1b is a simplified cross-section view of the installation showing schematically the lower and upper supports.

Referring first to FIGS. 1a and 1b, the different parts of the installation will be described, and more precisely, the lower part of this installation intended for supporting the lower artwork and in a certain way, the printed circuit, and particularly the lower artwork support.

FIG. 1a shows the fixed lower supporting structure of the machine referenced 10 as well as the lower artwork support 12. This lower support 12 is made of a rectangular metal frame 14 on which a glass 16 is fixed, glass on which actually rests the lower artwork.

In the exposure installation, the lower artwork support 12 directly rests on the horizontal upper side of the supporting structure 10. In order to allow the displacements of the support 12, it rests on the supporting structure 10 through ball supporting systems without friction, for example schematised in 18. In this particular example, supporting is made through four balls arranged on the four sides of the frame 14. This system, for example with balls described later in detail, allows the supporting structure to mechanically support all of the lower support while ensuring the support with an extremely reduced friction. It will be understood that thanks to this arrangement the force to be exerted in order to move the lower support 12 will then be very small, which will allow to reduce accordingly the power and thus the size of the motors used to achieve this displacement. Other supporting means such as an air cushion could be used only if it does create a very reduced friction between the frame and the supporting structure.

This Figure also shows the displacement devices 20 and 22 for respectively moving the lower support 12 in X and in XY. As has already been explained, the displacement tables which are integral with the supporting structure 10 do not achieve any supporting function and are only used to move the support with respect to the supporting structure, it being added that the friction between these two pieces is very small and thanks to the presence of balls, the necessary energy is reduced. FIG. 1a also shows schematically electromagnetic brakes or any other similar braking system in 24. These braking systems 24 regularly distributed over the frame 14 enable the immobilisation of the frame 14 and thus of the whole lower artwork support 12 with respect to the supporting structure 10 when a correct positioning has been obtained. These braking devices 24 are made necessary because of the connection without friction between the supporting structure and the lower support and because of the very low power of the motors used to achieve the displacement tables 20 and 22.

The upper part of the machine is made exactly in the same way except for the fact that the lower supporting structure 10 is stationary both in the horizontal plane and in the vertical plane, whereas the upper supporting structure is naturally stationary in a horizontal plane but mobile in a vertical plane to allow the upper artwork application on the printed circuit and on the lower artwork. Thus, the upper part of the machine will not be described.

FIG. 1b shows a schematic cross-section view of all of the exposure installation. The lower support 12 intended to receive the lower artwork 12a rests on the fixed lower supporting structure. This figure also shows the upper artwork 30 which is held through mechanisms 31 such as rack pinion systems allowing to raise or to lower the whole upper supporting structure 30. Moreover, this supporting structure 30 is of course fixed in a horizontal plane. The upper support 32 identical to the lower support 12 is mounted on the upper supporting structure 30 and is intended to receive the upper artwork 32a. FIG. 1b shows schematically the displacement motors in X and XY referenced 34 and 36 which make it possible to control the displacement of the support 32 with respect to the upper supporting structure 30.

The general operation of the exposure installation according to the invention is henceforth clear:

At first, the upper supporting structure 30 being spaced apart and the artworks 12a and 32a being in place, the printed circuit to be exposed is arranged between the supports 12 and 32. The printed circuit to be exposed is taken by immobilisation devices (not shown) which enable the printed circuit to be immobilised in a horizontal plane with respect to the upper and lower supporting structures. The pre-positioning errors of the lower support 12 and of the upper support 32 are measured with respect to the printed circuit with the optical systems (not shown). Since the printed circuit remains stationary, the convenient displacements of the upper support 32 and of the lower support 12 are controlled with the motors 20, 22 and 34, 36 in order to obtain an alignment of the three elements or, as the case may be, an alignment of the upper support 32 with the upper side of the printed circuit and of the lower support 12 with the lower side of the printed circuit. When the correct positioning is obtained, the fastening devices 24 are activated. It is obvious that the invention also applies to the production of lower or upper artwork supports for exposure installations comprising only one artwork. In this case, there is only one support which is generally the lower support.

Figure 2:
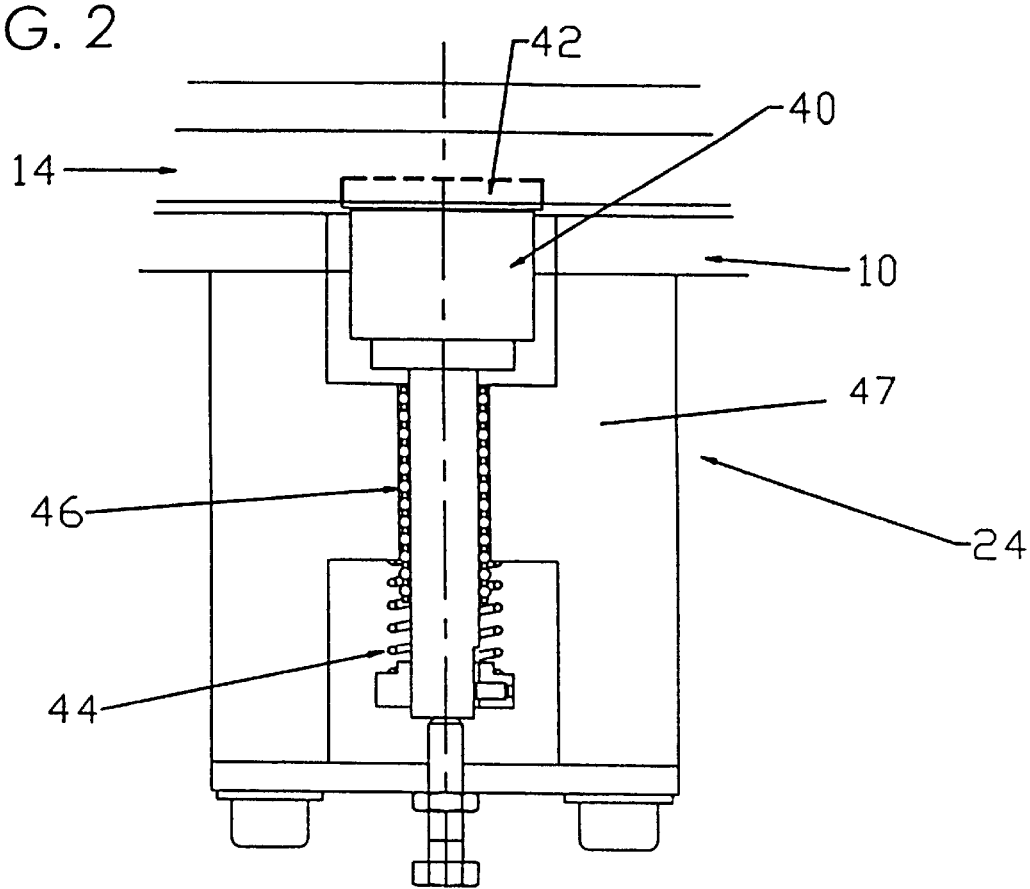
FIG. 2 is an elevational view of the fastening means for securing the artwork supports to the supporting structure.

Referring now to FIG. 2, an embodiment example of the fastening device 24 of the lower supporting structure 10 with the frame 14 of the lower support 12 will now be described. Identical devices would be used to secure the upper support 32 to the upper supporting structure 30. The immobilisation system is essentially made up of an electromagnetic head 40 which co-operates, when it is activated, with a ferromagnetic plate 42 integral with the lower side of the frame 14 of the lower support 12. When the magnetic head 70 is activated, fastening is obtained between the lower supporting structure 10 and the lower support 12. The electromagnetic head 40 is mounted via an elastic system 44 and a ball system 46. These fastening devices make it possible to maintain the strict positioning of the lower and upper supports when the upper support is lowered so as to establish a contact between the two artworks and the sides of the printed circuit 40. It is obvious that other fastening systems could be used for the frame of the artwork support on the supporting structure, for example low pressure systems or, on the contrary, systems with air jet under pressure. They must necessarily be controllable to allow free displacement of the support with respect to the supporting structure apart from the activation phases.

Figure 3:
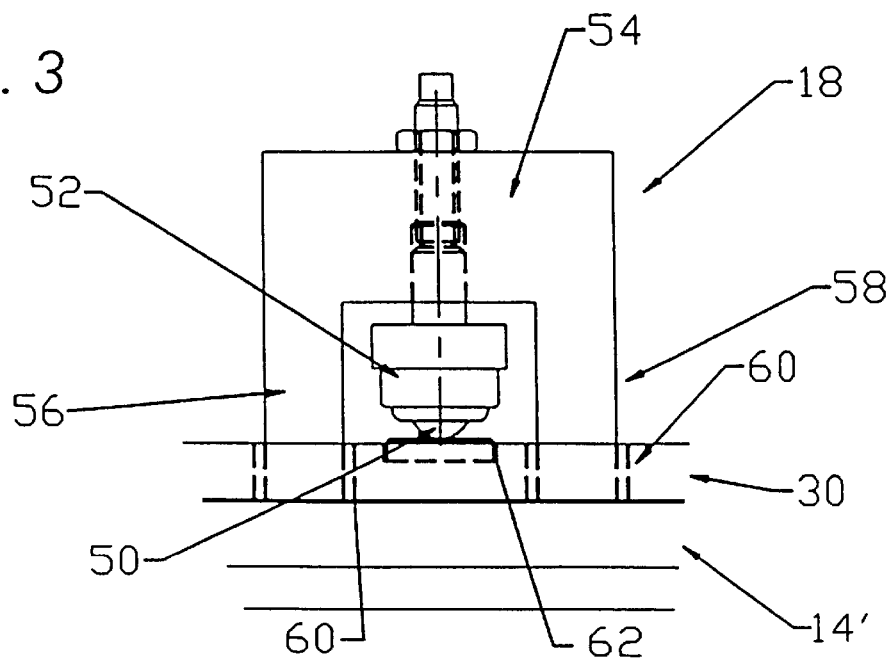
FIG. 3 is a detailed view showing supporting means of the artwork support with the supporting structure.

Referring now to FIG. 3, an embodiment of the supporting balls 18 which allows to support or lift the support with respect to the lower and upper supporting structures respectively will be described. FIG. 3 shows a lifting device 18 that connects the frame 14' of the upper support 12' to the upper supporting structure 30. The ball device essentially consists in a metal ball 50 mounted with a pivot in a cage 52 to Form a toggle-joint. The cage 52 is connected via a clamp system 54 to the frame 14' of the upper support. Therefore, the arms 56 and 58 of the clamp go through the structure 30 through holes such as 60. To ensure better running and therefore further decrease friction, the ball 50 co-operates with a running surface 62 integral with the upper side of the supporting structure 30.

When the supporting structure supports the frame of the lower support, it is the same ball system but the axis of which is reversed such that the cage 52 of the ball 50 is integral with the lower supporting structure 10 and the ball co-operates with the lower side of the frame 14 of the lower support 12.

The supporting or lifting system could also be made up of air cushion systems between the support frame and the supporting structure.

Figure 4:
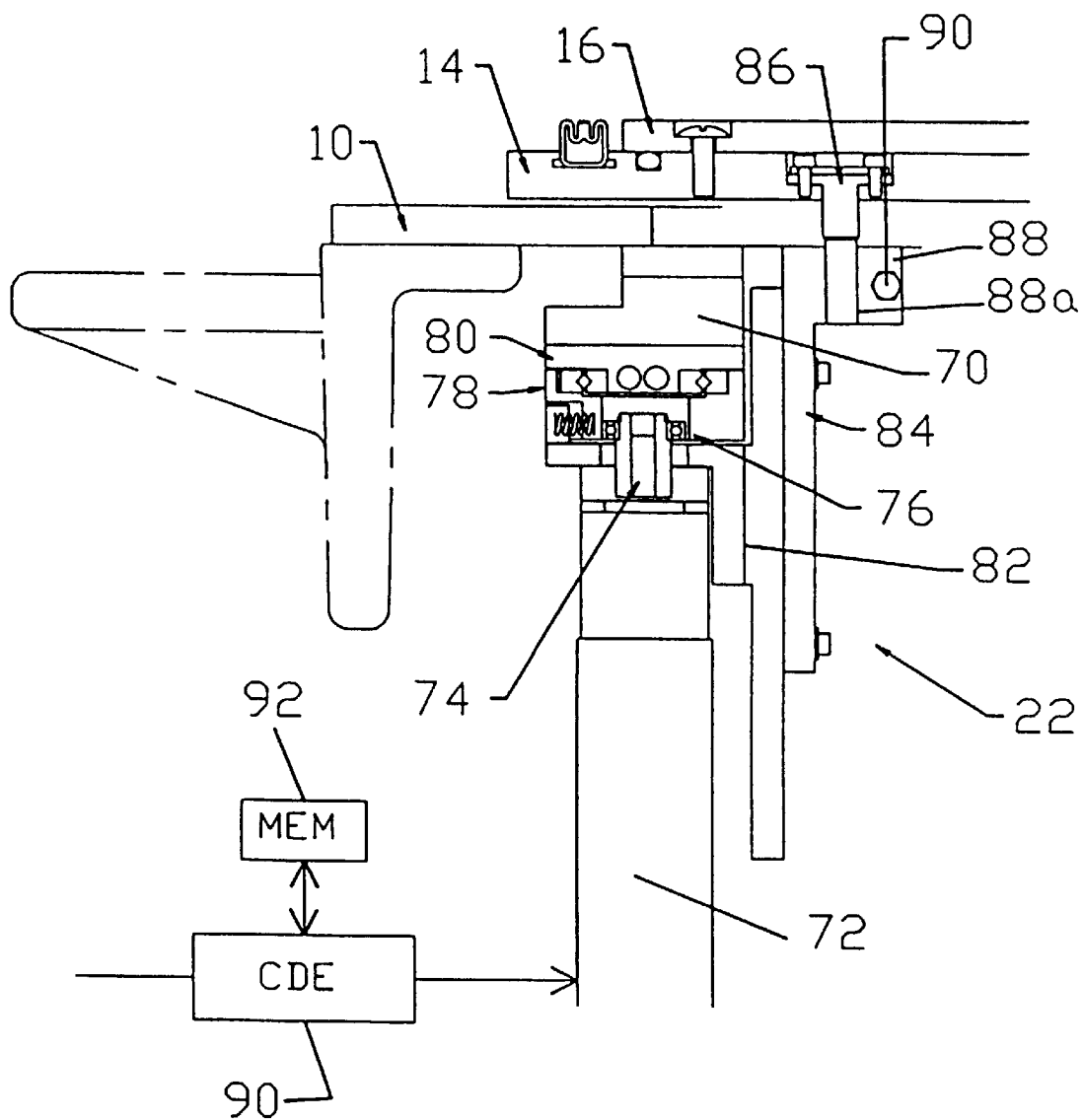
FIG. 4 is a detailed view showing an embodiment of the displacement motors for moving the lower support or the upper artwork support with respect to the fixed supporting structures.

Referring now to FIG. 4, a preferred embodiment of the displacement devices 20 and 22 or 34 and 36 allowing the final positioning of each support with respect to the corresponding supporting structure will be described. FIG. 4 shows for example the displacement device 22 allowing a displacement in X and in Y of the lower support 12. Similar displacement systems are used in connection with the upper supporting structure 30. The displacement system 22 includes a housing 70 that is integral with the supporting structure 10. For each displacement in X or in Y, there is a motor, for example 72 that is integral with the supporting structure 70. This motor includes a shaft 74 which ends with a cam 76 allowing to move a first displacement table 78 in the X direction. A second table 80, co-operating with the first table and combined with a second motor which controls the displacement in the Y direction and not shown in the Figure. With a mechanical gear 82, 84 integral with the second table, the combined displacement in X and in Y is applied to a piece 88 which defines a vertical bore 88a. A vertical pin 86 integral with the lower side of the frame 14 of the support can enter freely the bore 88a. The clearance in the horizontal plane between the piece 88 and the pin 86 is very small but there is no tightening. In order to adapt this clearance, the piece 88 is preferably a split ring provided with a nut 90 which is used to fit precisely the bore diameter 88a to the diameter of the pin 86. This connection method between the displacement means 22 and the support 12 is used to avoid the introduction of a torsion couple. The reversed mounting could be provided in which the pin would be integral with the table and the axial bore would be carried out in the support frame.

In order to further improve the precision of the displacements of the support despite any inaccuracies in the cams profiles, it is possible to adopt an electronic control for controlling the rotation of each motor. This control is performed via a table of correspondence between the angle of rotation of the particular cam used and the effective displacement of the table in X or in Y. This table is stored in the control circuits. The circuit determines the angle of rotation to be effected from the data of displacement in X or in Y to be carried out and the corresponding control is applied to the motor.

What we claim is:

1. A device for supporting an artwork for a light exposure installation for a flat piece, said device comprising:

a fixed horizontal supporting structure, a movable artwork support comprising a rectangular frame and a glass integral with said frame for receiving said artwork, said frame surrounding said glass and being secured to said glass, a plurality of means for supporting or lifting said support suitable for maintaining said support in a given horizontal plane and for producing a cooperation that is substantially without friction between said support and said supporting structure, whereby each one of said plurality of supporting or lifting means being interposed between said supporting structure and said frame and allowing the displacement of said support with respect to said support structure substantially without friction in all directions of said horizontal plane, a plurality of controllable means mounted on said support structure for temporarily securing said supporting structure to said frame, and displacement means integral with said supporting structure to move said support with respect to said supporting structure in a horizontal plane in all directions, whereby said plurality of controllable means permit said artwork to be held in a properly aligned position during light exposure installation of a flat piece.

2. A device according to claim 1, wherein said supporting or lifting means include ball means disposed between said support frame and said supporting structure.

3. A device according to claim 1, wherein said controllable means for controlling a temporary securing include electromagnetic means integral with said supporting structure.

4. A device according to claim 1, wherein said displacement means comprises of at least two displacement units, one of said units including a first motor integral with said supporting structure, cam means integral with the output shaft of said first motor to move a first table in the X direction, a second table co-operating with said first table to be moved in the X direction by said first table, second motor means integral with said first table, cam means integral with the output shaft of said second motor to move said second table in the Y direction that is orthogonal to the X direction, the connection between said second table and said frame being performed with a displacement vertical finger entering freely a vertical axial bore, said finger being integral with said support or with said second table, said bore being integral with the other piece.

5. A device according to claim 4, wherein each said motor includes a control circuit connected to a memory in which a correspondence table is stored, said correspondence table providing a correspondence between the rotation angles of each said cam mounted on each said motor and the respective linear displacement of the each respectively associated table.

\* \* \* \* \*